United States Patent [19]

Kitazawa et al.

[11] Patent Number: 5,522,940
[45] Date of Patent: Jun. 4, 1996

[54] PROCESS FOR CLEANING ELECTRONIC PARTS OR PRECISION PARTS

[75] Inventors: Kozo Kitazawa; Eiji Kashihara, both of Wakayama, Japan

[73] Assignee: Kao Corporation, Tokyo, Japan

[21] Appl. No.: 334,442

[22] Filed: Nov. 4, 1994

Related U.S. Application Data

[63] Continuation of Ser. No. 956,297, Oct. 5, 1992, abandoned.

[30]  Foreign Application Priority Data

Oct. 4, 1991 [JP] Japan ................................ 3-257745

[51] Int. Cl.$^6$ ................................ B08B 7/04; B08B 3/08
[52] U.S. Cl. ................................ 134/10; 134/26; 134/40
[58] Field of Search ................................ 134/2, 10, 26, 134/27, 28, 29, 30, 40

[56]  References Cited

U.S. PATENT DOCUMENTS

| | | | |
|---|---|---|---|
| 4,414,128 | 11/1983 | Goffinet | 134/40 |
| 4,740,247 | 4/1988 | Hayes et al. | 134/42 |
| 4,867,800 | 9/1989 | Dishart et al. | 134/40 |
| 4,983,224 | 1/1991 | Mombrun et al. | 134/40 |
| 5,096,501 | 3/1992 | Dishart et al. | 134/10 |

FOREIGN PATENT DOCUMENTS

| | | |
|---|---|---|
| 0402981 | 12/1990 | European Pat. Off. . |
| 0419089 | 3/1991 | European Pat. Off. . |
| 0464652 | 1/1992 | European Pat. Off. . |
| 0466054 | 1/1992 | European Pat. Off. . |

OTHER PUBLICATIONS

JP-A-54 149 330 Abstract.
Rep. Asahi Glass Found Ind. Technol., vol. 36, 1980, pp. 169–183, K. Shinoda, "How to Attain Very LowInterfacial-Tension at Oil–water interface?".

*Primary Examiner*—Jan H. Silbaugh
*Assistant Examiner*—Saeed T. Chaudhry
*Attorney, Agent, or Firm*—Sughrue, Mion, Zinn, Macpeak & Seas

[57] ABSTRACT

Disclosed is a process for cleaning electronic parts or precision parts which comprises the steps of: washing the parts with a cleaning agent composition, rinsing the washed parts with water having a temperature of from 5° to 100° C., and maintaining the rinsing waste water at a temperature of 20° C. or higher to effect separation of organic substances. The cleaning agent composition contains, as active cleaning components, a nonionic surface active agent and a compound selected from the group consisting of hydrocarbon compounds and slightly water soluble alkyl esters or alkyl ketones. The composition is such that 50% by weight or more of the organic substances separate from the water phase when the composition is made into an aqueous solution having an organic substance content of 5% by weight adjusted by diluting it with water or by evaporating water from it and the resulting cleaning agent aqueous solution is subsequently allowed to stand still for 30 minutes at a temperature of from 20° to 100° C.

According to the present invention, organic substances in rinsing waste water can be separated and removed efficiently, and subsequent waste water treatment step can be simplified. The process is economically advantageous, because the rinsing waste water after the separation treatment can be used again as a rinsing liquid.

8 Claims, No Drawings

PROCESS FOR CLEANING ELECTRONIC PARTS OR PRECISION PARTS

This is a continuation of application No. 07/956,297 filed Oct. 5, 1992 now abandoned.

FIELD OF THE INVENTION

This invention relates to a process for cleaning electronic parts and precision parts, machine tools in assembling or processing these parts, or the like, when they are stained with fat and oil, machine oil, cutting oil, grease, crystalline liquid, flux and the like. More particularly, it relates to a cleaning process which features excellent processability of the waste water resulting from the rinsing step.

BACKGROUND OF THE INVENTION

For the purpose of cleaning the surface of precision parts, machine tools and the like by removing stains consisting mainly of organic substances such as fat and oil, machine oil, cutting oil, grease, crystalline liquid, flux and the like, various cleaning agents have been used. For example, hydrocarbon solvents such as kerosin, benzene, xylene and the like; chlorine-based solvents such as trichloroethylene, tetrachloroethylene and the like; flon-based solvents such as trichlorotrifluoroethane and the like; and aqueous cleaning agents blended with surface active agents, builders and the like have been conventionally used. Especially, for cleaning electronic, electric and machine parts, flon- or chlorine-based solvents have been used, taking advantage of their characteristic properties of high detergency and incombustibility.

However, cleaning agents which comprise flon- or chlorine-based solvents have serious problems in terms of safety, toxicity, environmental pollution and the like. On the other hand, hydrocarbon solvents, especially benzene, xylene and the like, have high toxicity and are characterized as toxic substances according to industrial safety and hygiene standards. Consequently, use of such hydrocarbon solvents as cleaning agents is not preferable when hazardous and complex handling of these substances is taken into consideration.

Aqueous cleaning agents are not so hazardous and have a low toxicity in comparison with cleaning agents containing solvents, and their detergency can be improved by optionally selecting cleaning agent composed of elements such as surface active agents, builders and the like. However, being highly soluble in water in general, these aqueous cleaning agents have the disadvantage of markedly poor processability of the rinsing waste water which is discharged when a cleaning liquid adhered to a material to be washed is rinsed with an aqueous rinsing solution. Although treatment of such rinsing waste water can be carried out making use of coagulating sedimentation, pressure floatation, activated sludge methods, active carbon treatment or the like, each of these treatment processes is expensive and requires additional equipment.

Consequently, great concern has been directed toward the development of an industrially advantageous process for cleaning of electronic parts, precision parts or the like, which does not require such expensive waste water treatments or additional equipment therefor.

SUMMARY OF THE INVENTION

Taking such prior art problems into consideration, the inventors of the present invention have conducted intensive studies and found that organic substances which remain in rinsing waste water, such as oily substances and cleaning agents, can be easily separated and removed from the rinsing liquid when a material washed with a specific cleaning agent is rinsed with water having a temperature of from 5° to 100° C. and the resulting rinsing waste water is maintained at a temperature of 20° C. or higher. As a result, waste water processability is improved markedly and the rinsing waste water can be used again after the organic substances are separated and removed therefrom. The present invention has been accomplished on the basis of these findings.

Particularly, in accordance with the present invention, there is provided a process for cleaning electronic parts or precision parts which comprises the steps of: (i) washing the parts with a cleaning agent composition (washing step), (ii) rinsing the washed parts with water having a temperature of from 5° to 100° C. (rinsing step), and (iii) maintaining the rinsing waste water at a temperature of 20° C. or higher to effect separation of the organic substances from a water phase (separation step). The cleaning agent composition contains, as active cleaning components, a nonionic surface active agent and a compound selected from the group consisting of hydrocarbon compounds and slightly water- .soluble alkyl esters or alkyl ketones; and the cleaning agent composition is such that 50% by weight or more of the organic substances separate from the water phase when the composition is made into an aqueous solution having an organic substance content of 5% by weight adjusted by diluting it with water or by evaporating water from it and the resulting cleaning agent aqueous solution is subsequently allowed to stand still for 30 minutes at a temperature of from 20° to 100° C.

DETAILED DESCRIPTION OF THE INVENTION

According to the present invention, the cleaning agent composition used in the washing step contains, as active cleaning agent components, a nonionic surface active agent and a compound selected from the group consisting of hydrocarbon compounds and slightly water soluble alkyl esters and alkyl ketones. The content of the nonionic surface active agent may be 0.5 to 99%, preferably 2 to 90%, based on the total weight of the active cleaning agent components. The cleaning agent composition is such that 50% or more (up to about 100%) of the organic substances separate from the water phase when the composition is made into an aqueous solution having an organic substance content of 5% adjusted by diluting it with water or by evaporating water from it and the resulting cleaning agent aqueous solution is subsequently allowed to stand still for 30 minutes at a temperature of from 20° to 100° C., preferably 20° to 70° C. The content of an organic substance in the aqueous solution can easily be obtained by measuring TOC (total organic carbon), COD (chemical oxygen demand), etc. If the amount of organic substances which separate under these conditions is less than 50%, the components of the cleaning agent cannot be separated sufficiently from rinsing waste water after the rinsing step. As a result, foul organic substances such as oily stains are apt to be dissolved, emulsified or dispersed in the water phase, thus resulting in insufficient improvement of the waste water processability. In addition, when a water phase in such a state is used again as a rinsing liquid after the separation step, its rinsing effect becomes markedly low because of its high organic substance content. For the purpose of improving the waste water processability more efficiently and making possible the recycled use of the rinsing liquid, it is preferable to use a cleaning agent in which 70% or more of the organic substances separate.

Any cleaning agent composition may be used in the cleaning process of the present invention, provided that it possesses the aforementioned characteristic properties and has a satisfactory detergency. A preferred example of such a composition contains a nonionic surface active agent having a clouding point at from −10° C. to 100° C., preferably 10° C. to 80° C., and a compound which is used for the improvement of oily stain detergency and is selected from the group consisting of hydrocarbon compounds and slightly water soluble alkyl esters and alkyl ketones. These components may be used in the cleaning agent composition in an amount of at least 50% by weight based on the total organic component thereof, preferably 70% or more, to improve rinsing capacity. The term "clouding point" as used herein means the temperature at which the solution of the cleaning agent composition becomes cloudy, particularly when 10 to 30 ml of a solution of the composition prepared by diluting it with ion-exchanged water by a factor of 20 is put into a test tube and temperature of the solution is increased at a rate of 1° C./min. When a solution of the cleaning agent composition is maintained at a temperature equal to or higher than the clouding point, the nonionic surface active agent in the solution starts to separate gradually from the water phase.

Examples of the nonionic surface active agents include for instance: ether type surface active agents such as alkyl ether, alkyl allyl ether, alkyl thioether and the like types; ester types such as alkyl ester, sorbitan alkyl ester and the like types; amine-condensation types such as polyoxyalkylene alkylamine and the like; amide-condensation types such as polyoxyalkylene alkylamide and the like; Pluronic or Tetronic types produced by random or block condensation of polyoxyethylene with polyoxypropylene; and polyethyleneimine-based surface active agents. Of these, agents having a hydrocarbon radical of 4 to 22 carbon atoms, preferably of 4 to 18 carbon atoms, are particularly preferred. When such a nonionic surface active agent is used in the cleaning agent composition, the composition shows improved detergency due to its increased affinity for oily stains, and the resulting rinsing waste water from the rinsing step shows a distinct clouding point when the nonionic surface active agent is present in the waste water, thus entailing especially excellent waste water processability.

Examples of the hydrocarbon compounds include straight- or branched-chain paraffins or olefins having saturated or unsaturated bonds, or aromatic or alicyclic hydrocarbon compounds, each having 6 to 30 carbon atoms, preferably 8 to 16 carbon atoms, and being in the liquid form within the temperature range for the washing or rinsing step.

Examples of the alkyl esters include monoesters, diesters and triesters, each having 6 to 40 carbon atoms, preferably 8 to 25 carbon atoms, and being in the liquid form within the temperature range for the washing or rinsing step. Solubility of the alkyl esters is preferably 0.3% or less in water having a temperature of 25° C. Particularly preferred examples are: an ester of a higher fatty acid having 6 to 18 carbon atoms with a higher alcohol having 1 to 18 carbon atoms; an ester of a higher fatty acid having 6 to 18 carbon atoms with a diol or a triol having 2 to 8 carbon atoms; and an ester of a higher alcohol having 1 to 18 carbon atoms with a dicarboxylic or tricarboxylic acid having 2 to 8 carbon atoms.

Examples of the alkyl ketones include dialkyl ketones having 6 to 40 carbon atoms, preferably 8 to 25 carbon atoms. Solubility of the alkyl ketones is preferably 0.5% or less in water having a temperature of 25° C.

In addition to these components, the cleaning agent composition of the present invention may also contain, when required, a surface active agent such as an anionic type or the like, a builder, a chelating agent, an anticorrosion agent, an antifoaming agent and the like.

Though not particularly limited, the washing step may be effected by means of dipping, ultrasonic cleaning, oscillation, spraying and the like. These means may be employed alone or in combination. The content of the active cleaning agent components in the cleaning agent composition in the washing step may be 5 to 100%, preferably 50 to 100%.

The term "rinsing liquid" as used herein means a liquid which is used in the rinsing step to rinse off a cleaning liquid containing foul substances and/or the cleaning agent composition from a material to be cleaned. Pure water may be preferable as such a rinsing liquid from a detergency point of view. From the viewpoint of waste water processability, however, it is most preferable to use recycled rinsing waste water from which organic substances have been separated and removed.

The rinsing step may be effected by means of dipping, ultrasonic cleaning, oscillation, spraying or the like method, using a rinsing liquid having a temperature of from 5° to 100° C., preferably from 20° to 70° C. A temperature outside this range is not preferable, because additional cost, equipment and the like are required for heating, cooling and the like of the rinsing liquid.

In the separation step, rinsing waste water resulting from the rinsing step is heated or cooled to a temperature of from 20° to 100° C., preferably from 20° to 70° C., to effect separation and removal of organic substances, resulting in the content of organic substances being 50% or less. Heating the rinsing waste water at a temperature of higher than 100° C. is not advantageous from a practical point of view, because it requires additional equipment for pressurization or the like. Maintenance of the rinsing waste water at a temperature lower than 20° C. is also disadvantageous from the viewpoint of practical use, because it requires a cooling system or the like, especially during the summer season. It is especially preferable to control the rinsing waste water at a temperature equal to or higher than the clouding point of the nonionic surface active agent contained in the cleaning agent composition for the purpose of separating organic substances efficiently. In other words, a nonionic surface active agent is deprived of its water solubility when its temperature exceeds its clouding point and, as a result, oily stains solubilized or emulsified in the rinsing liquid separate from the water and float or precipitate depending on their specific gravities. In addition, being deprived of water solubility, the nonionic surface active agent itself also separates from the water.

Removal of the thus separated organic substances such as a nonionic surface active agent, a hydrocarbon compound, foul oily substances and the like may be effected for example by scooping up or continuously drawing out the organic substances which have been concentrated in the upper or lower part of the rinsing waste water contained in a reserve tank or a special separation tank, or by making use of an auxiliary means such as a separation membrane. By carrying out the separation step efficiently, the rinsing waste water is clarified to such a purity that it can be used again, or recycled, as a rinsing liquid. If necessary, the thus clarified rinsing waste water may be subjected to ion exchange treatment, active carbon adsorption, membrane separation or the like prior to its recycled use, in order to remove organic substances such as water soluble ions, surface active agents and the like.

The cleaning process of the present invention is especially effective for cleaning precision parts and machine tools which are used for assembling and processing precision parts. In this instance, examples of the precision parts include electronic parts, electrical parts, precision instrument parts, resin finishing parts, optical parts and the like. Illustrative examples of the electronic parts include: printed wiring substrates for use in electronics-aided instruments such as computers and peripheral devices thereof, domestic electrical instruments, communications instruments, OA instruments and the like; hoop materials for use in contact parts such as IC lead frames, resistors, condensers, relays and the like; liquid crystal displays for use in OA instruments, clocks, computers, toys, domestic electrical instruments and the like; magnetic recording parts for use in recording/reproduction of image or sound and related parts thereof; semi-conductor materials such as silicon or ceramic wafers and the like; parts for electrostriction use such as quartz oscillators and the like; and photoelectric transfer parts for use in CD, PD, copying instruments, optical recording instruments and the like. Illustrative examples of the electrical parts include: motor parts such as a brush, a rotor, a stator, a housing and the like; ticket delivery parts for use in vending machines and various other instruments; and coin-checking parts for use in vending machines, cash dispensers and the like. Illustrative examples of the precision instrument parts include: bearings for use in precision drivers, video recorders and the like; and parts for processing use such as super hard tips and the like. Illustrative examples of the resin finishing parts include for instance precision resin finishing parts for use in cameras, cars and the like. Illustrative examples of the optical parts include for instance lenses for use in cameras, eyeglasses, optical instruments and the like, in addition to other related parts such as spectacle rims, clock housings, watch bands and the like. Illustrative examples of the machine tools include those which are used in respective steps for manufacturing, molding, processing, assembling, finishing and the like of the precision parts described above, as well as various types of instruments and parts thereof that are used for the handling of precision parts.

Though the cleaning process of the present invention is effective especially for cleaning flux-stained printed wiring substrates, crystalline liquid-stained glass substrates and the like, the inventive cleaning process can be applied to any type of precision part or machine tool, provided that these materials have a solid surface which has been stained with after treatment-inhibiting substances such as various types of process oil, flux and the like during assembling and processing steps or with various types of oily foul substances that deteriorate the characteristic properties of the final products. The cleaning process of the present invention exerts its characteristic effect especially when the foul substances are mainly organic oily substances such as fat and oil, machine oil, cutting oil, grease, crystalline liquid, rosin-based flux and the like. Such foul substances can be cleaned effectively even when they are contaminated with metal powder, inorganic powder and the like.

The following examples are provided to further illustrate the present invention. It is to be understood, however, that the examples are for purpose of illustration only and are not intended to limit the scope of the invention.

EXAMPLES 1 TO 4 AND COMPARATIVE EXAMPLES 1 TO 3

Cleaning agent compositions having the formulations of Table 1 were prepared. Each of the compositions was diluted with ion-exchanged water by such a dilution factor that the resulting solution contained organic substances in a total amount of 5%, and the thus prepared cleaning agent solutions were allowed to stand still for 30 minutes at a temperature of 30° C. (Examples 3 and 4 and Comparative Example 3) or 70° C. (Examples 1 and 2 and Comparative Examples 1 and 2). In each case of the Examples 1 to 4, separation of 50% or more of organic substances from the water phase was confirmed, as shown in Table 1.

Next, each of the cleaning agent compositions of Table 1 was checked for its detergency after 3 minutes of ultrasonic cleaning at 40° C., using three test materials to be cleaned: a printed wiring board (10 cm×15 cm) treated with a rosin-based flux [Test Material 1], a steel test piece (10 cm×15 cm) coated with a naphthene base mineral oil (40° C., 350 cSt) to a thickness of 1 g/m$^2$ [Test Material 2] and a glass plate (10 cm×10 cm) coated with crystalline liquid (5 g/m$^2$) [Test Material 3]. When each of the thus cleaned Test Materials 1 to 3 was soaked in ion-exchanged water and rinsed for 1 minute at 40° C. by exposing it to ultrasonic wave, it showed an excellent appearance.

Next, each volume of the rinsing waste water resulting from the rinsing step was subjected to a separation treatment by allowing it to stand still for 30 minutes at 50° C. In this instance, organic substances were separated into an upper or a lower water layer in each of the Examples. Each of the water layers was sampled to measure its COD (chemical oxygen demand). The thus measured COD (Value A) was compared with the COD of the rinsing waste water before the separation treatment (Value B) to calculate an organic substance separation ratio [(Value B−Value A)÷(Value B)]× 100. The results are shown in Table 1.

TABLE 1

|  | Examples |  |  |  | Comp. Exs. |  |  |
|---|---|---|---|---|---|---|---|
|  | 1 | 2 | 3 | 4 | 1 | 2 | 3 |
| Materials to be cleaned |  |  |  |  |  |  |  |
| Test Material 1 | 0 |  |  |  | 0 |  |  |
| Test Material 2 |  | 0 |  |  |  | 0 |  |
| Test Material 3 |  |  | 0 | 0 |  |  | 0 |
| Cleaning agent compositions |  |  |  |  |  |  |  |
| (POE)$_2$ hexyl ether |  | 11 | 30 | 60 |  | 5 |  |
| (POE)$_{10}$ lauryl ether |  | 20 | 20 | 5 |  |  |  |
| (POE)$_{35}$ oleyl ether |  |  | 10 |  | 20 |  | 35 |
| (POE)$_{15}$ (POP)$_2$ decyl ether | 35 |  |  |  |  |  |  |
| Na dodecylbenzenesulfonate |  |  |  |  | 10 | 20 |  |
| olefin (mean C atoms, 14) | 5 | 60 | 30 | 25 |  |  | 5 |
| butyl laurate |  |  | 20 |  | 2 |  |  |
| water | 49 | 10 |  | 10 | 68 | 75 | 60 |
| Organic substance separation ratio from the cleaning agent composition solution (%) | 85 | 96 | 80 | 78 | 7 | 12 | 20 |
| COD in rinsing waste water |  |  |  |  |  |  |  |
| after separation step (A) | 11 | 4 | 5 | 5 | 47 | 24 | 11 |
| before separation step (B) | 40 | 70 | 73 | 60 | 50 | 26 | 15 |
| Organic substance separation ratio from the rinsing waste water (%) | 73 | 94 | 93 | 92 | 6 | 8 | 27 |

Note: (POE)$_n$, polyoxyethylene; (POP)$_n$, polyoxypropylene; COD, measured by Mn method (g/l)

As shown in the above table, in each of Examples 1 to 4, the separation ratio of the organic substances was high, and the COD level in rinsing waste water after its separation treatment was low, thus confirming a low content of organic substances in the treated rinsing waste water. When each water phase portion of the rinsing waste water samples after their separation treatment was used again as rinsing liquid, samples having an organic substance separation ratio of 50% or more (all from Examples 1 to 4), especially having a separation ratio of 70% or more, showed an excellent rinsing capacity.

Thus, it is apparent that there has been provided, in accordance with the present invention, a cleaning process which features excellent processability of the waste water resulting from a rinsing step. According to the process of the present invention, organic substances in rinsing waste water can be separated and removed efficiently in a high concentration, and subsequent waste water treatment step can therefore be simplified. Because of such effects, the inventive process can be applied industrially advantageously, especially to the cleaning of electronic parts, precision parts and the like which have been stained with fat and oil, machine oil, cutting oil, grease, crystalline liquid, flux and the like. In addition, the inventive cleaning process is advantageous from an economical point of view, because the rinsing waste water after the separation treatment can be used again as a rinsing liquid, and the amount of water used for rinsing can therefore be reduced sharply.

Although some preferred embodiments have been described, many modifications and variations may be made thereto in the light of the above teachings. It is to be understood therefore that within the scope of the appended claims, the invention may be practiced otherwise than as specifically described.

What is claimed is:

1. A process for cleaning electronic parts or precision parts which comprises the steps of:

washing said parts with a cleaning agent composition, rinsing the washed parts with water having a temperature of from 5° to 100° C. to obtain a rinsing waste water, and maintaining the rinsing waste water at a temperature of at least 20° C., said temperature being equal to or higher than the clouding point of a nonionic surface active agent contained in the cleaning agent composition to effect separation of organic substances from a water phase;

wherein said cleaning agent composition contains 10 to 49 wt % of water and, as active cleaning agent components, the nonionic surface active agent in an amount of from 33.3 to 99% based on the total weight of said active cleaning agent components and having a clouding point at from 20° to 100° C., and a compound selected from the group consisting of hydrocarbon compounds and slightly water soluble alkyl esters and alkyl ketones, and said cleaning agent composition is such that 70% by weight or more of organic substances separate from the water phase when said composition is made into an aqueous solution having an organic substance content of 5% by weight adjusted by diluting it with water or by evaporating water from it and the resulting cleaning agent aqueous solution is subsequently allowed to stand still for 30 minutes at a temperature of from 20° to 100° C.

2. The cleaning process according to claim 1, wherein a clarified portion of said rinsing waste water, resulting from the separation and removal of organic substances, is recycled and used again as a rinsing liquid.

3. The cleaning process according to claim 1, wherein said nonionic surface active agent and said compound constitute at least 50% by weight of the total organic component of the composition.

4. The cleaning process according to claim 1, wherein said nonionic surface active agent and said compound constitute at least 70% by weight of the total organic component of the composition.

5. The cleaning process according to claim 1, wherein said nonionic surface active agent is selected from the group consisting of an ether, ester, amine-condensation, amide-condensation, Pluronic, Tetronic and poly-ethyeneimine-based surface active agent.

6. The cleaning process according to claim 1, wherein said rinsing step occurs with water having a temperature of from 20° to 70° C.

7. The cleaning process according to claim 1, wherein said rinsing waste water is maintained at a temperature of 20° to 100° C.

8. The cleaning process according to claim 1, wherein said rinsing waste water is maintained at a temperature of 20° to 70° C.

* * * * *